(12) United States Patent
Baba et al.

(10) Patent No.: US 10,622,384 B2
(45) Date of Patent: Apr. 14, 2020

(54) LIQUID CRYSTAL DISPLAY PANEL AND LIQUID CRYSTAL DISPLAY

(71) Applicant: Mitsubishi Electric Corporation, Tokyo (JP)

(72) Inventors: Tatsuya Baba, Tokyo (JP); Takafumi Hashiguchi, Tokyo (JP); Naoya Hirata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 105 days.

(21) Appl. No.: 15/874,235

(22) Filed: Jan. 18, 2018

(65) Prior Publication Data

US 2018/0217431 A1 Aug. 2, 2018

(30) Foreign Application Priority Data

Jan. 30, 2017 (JP) .................................. 2017-014039

(51) Int. Cl.
*H01L 27/12* (2006.01)
*G02F 1/1362* (2006.01)
(Continued)

(52) U.S. Cl.
CPC .......... *H01L 27/124* (2013.01); *G02F 1/1345* (2013.01); *G02F 1/136286* (2013.01); *G02F 1/1368* (2013.01); *G02F 1/133707* (2013.01); *G02F 1/134309* (2013.01); *G02F 1/136213* (2013.01); *G02F 2001/133776* (2013.01); (Continued)

(58) Field of Classification Search
CPC ........... G02F 1/136286; G02F 1/13454; G02F 1/136213; G02F 1/133707; G02F 2001/133776; G02F 2001/134372; G02F 2201/2201; G09G 2300/0426;
(Continued)

(56) References Cited

U.S. PATENT DOCUMENTS

2002/0180920 A1 12/2002 Noh et al.
2012/0112200 A1* 5/2012 Nagano ............. G02F 1/134363
257/72
(Continued)

FOREIGN PATENT DOCUMENTS

JP   H08-286202 A   11/1996
JP   H09-311341 A   12/1997
(Continued)

*Primary Examiner* — Angela K Davison
(74) *Attorney, Agent, or Firm* — Studebaker & Brackett PC

(57) ABSTRACT

A liquid crystal display panel includes, on one of two substrates with liquid crystal held therebetween, first and second wires respectively arranged in a first and a second directions, third wires arranged in the first direction and connected to the second wires, pixels arranged corresponding to crossing positions between the first and the second wires, a first and a second driver ICs respectively connected to each first and each third wires. Each pixel includes a lower electrode, an upper electrode including slits, and domains alignment-divided in accordance with formation directions of the slits. One of the lower and the upper electrodes is a pixel electrode and the other is a common electrode. Each third wire is placed in a boundary between the domains. With this structure, provided is a liquid crystal display capable of narrowing a frame area and improving display quality.

9 Claims, 5 Drawing Sheets

(51) Int. Cl.
*G02F 1/1345* (2006.01)
*G02F 1/1368* (2006.01)
*G02F 1/1343* (2006.01)
*G02F 1/1337* (2006.01)
*H01L 27/32* (2006.01)

(52) U.S. Cl.
CPC .... *G02F 2201/121* (2013.01); *G02F 2201/40* (2013.01); *G09G 2300/0426* (2013.01); *G09G 2310/0262* (2013.01); *G09G 2310/0281* (2013.01); *G09G 2310/0283* (2013.01); *H01L 27/1255* (2013.01); *H01L 27/3279* (2013.01)

(58) Field of Classification Search
CPC ... G09G 2310/0262; G09G 2310/0281; G09G 2310/0283; H01L 27/124
See application file for complete search history.

(56) References Cited

U.S. PATENT DOCUMENTS

| | | | |
|---|---|---|---|
| 2014/0168552 A1 | 6/2014 | Jo et al. | |
| 2016/0093640 A1* | 3/2016 | Kawamura | H01L 27/124 |
| 2017/0115543 A1* | 4/2017 | Zou | G02F 1/133345 |
| 2017/0146861 A1* | 5/2017 | Takeshita | G02F 1/133707 |

FOREIGN PATENT DOCUMENTS

| | | |
|---|---|---|
| JP | 2003-021845 A | 1/2003 |
| JP | 2014-119746 A | 6/2014 |

\* cited by examiner

LIQUID CRYSTAL DISPLAY PANEL AND LIQUID CRYSTAL DISPLAY

BACKGROUND OF THE INVENTION

Field of the Invention

The present invention relates to a liquid crystal display panel and a liquid crystal display, and more particularly to a technique for narrowing the width of a frame while suppressing reduction in the aperture ratio of pixels.

Description of the Background Art

At the present time, widely used are display devices having a thin planar shape which utilize principles such as liquid crystal, electroluminescence (EL), and the like. A liquid crystal display, which is typical of these display devices, has characteristics such as not only thin and light but also allowing low-voltage driving. A liquid crystal display is formed of a liquid crystal display panel in which liquid crystal is sealed between two substrates which constitute a main part. One of the substrates is an array substrate having a display area in which a plurality of pixels are arranged in a matrix form and the other substrate is a counter substrate (color filter substrate) on which a color filter and a black matrix (light shielding film), corresponding to each pixel, are formed.

A thin film transistor (TFT) type liquid crystal display can provide video images with less crosstalk and high display quality. This is because a TFT serving as a switching element is provided in each pixel on the array substrate and each pixel can independently hold a voltage for driving the liquid crystal. The TFT is connected to a gate wire serving as a scanning wire which controls on/off of the TFT and a source wire serving as a signal wire for inputting image signals. Each pixel is usually surrounded by the gate wire and the source wire. In a frame area positioned on the periphery of a display area on the array substrate, provided is a drawing wire for connecting the gate wire or the source wire to a driver IC.

In recent years, while the thin-type liquid crystal displays are widely used, required functions and styles of products have been diversified. Therefore, mainly in the field of display devices for portable terminal and in-vehicle display devices, for the purpose of improving design, the needs for liquid crystal displays in which a frame area which is a non-display area is narrowed have been increasing.

In a conventional case, however, where drawing wires connected to gate wires at a constant pitch are arranged in a frame area, the frame area needs to have a size not smaller than an area obtained by multiplying a sum of the width of the gate wire and the pitch of the gate wires by the number of gate wires.

Japanese Patent Application Laid-Open No. 2014-119746 discloses a liquid crystal display device in which a bezel width, i.e., a frame area is size-reduced. In a plane of a liquid crystal display panel included in the liquid crystal display device, a first gate line (gate wire) and a data line (source wire) are arranged adjacent to and in parallel with each other in a vertical direction. Further, in a horizontal direction, formed is a second gate line (gate wire) which intersects and is connected to the first gate line. The first gate line and the data line which are formed in the vertical direction are connected to a driver IC formed on one side of the periphery of the display area, through a gate link line (drawing wire) provided in a bezel area. With such a structure, it is possible to omit the link line and gate driver IC which are formed in left and right non-display areas in the liquid crystal display panel and therefore to narrow the bezel width.

The gate wire (first gate line) and the source wire (data line) which are arranged adjacent to and in parallel with each other, however, do not transmit light. Further, in order to prevent reflection of backlight light by the wires or ambient light of the surroundings of the display device, it is necessary to cover the wires with the black matrix formed on the color filter substrate. As a result, the aperture ratio of an pixel provided by the arrangement in which the gate wire and the source wire are disposed adjacent to and in parallel with each other is reduced more significantly than that of an pixel provided by an arrangement in which one source wire is disposed in a longitudinal direction with respect to the pixel. Moreover, parasitic capacitance is generated between the gate wire and the source wire which are disposed in parallel around the pixel, and this reduces the display quality.

Thus, in the conventional liquid crystal display, since the drawing wire connected to the gate wire and the driver IC are provided on the left and right of the frame area, narrowing of the frame area is prevented. Further, in the liquid crystal display device disclosed in Japanese Patent Application Laid-Open No. 2014-119746, the aperture ratio of a pixel is reduced or the display quality is deteriorated due to the parasitic capacitance.

SUMMARY

In the present specification, it is an object to provide a liquid crystal display panel capable of narrowing a frame area and improving display quality.

The liquid crystal display panel in the present specification includes, on one substrate of two substrates disposed opposite to each other with liquid crystal held therebetween, a plurality of first wires arranged in a first direction, a plurality of second wires arranged in a second direction, a plurality of third wires arranged in the first direction and connected to the plurality of second wires, a plurality of pixels arranged in a matrix form corresponding to crossing positions between the plurality of first wires and the plurality of second wires, the plurality of pixels forming a display area, a first driver IC provided outside the display area and connected to each of the plurality of first wires, the first driver IC controlling a switching element included in each of the plurality of pixels connected to each of the plurality of first wires, and a second driver IC provided outside the display area and connected to each of the plurality of third wires, the second driver IC controlling the switching element included in each of the plurality of pixels connected to each of the plurality of second wires, through each of the plurality of third wires. Each of the plurality of pixels includes a lower electrode, an upper electrode including a plurality of slits formed extending in a plurality of directions in a plane of the one substrate, the upper electrode being provided on the lower electrode with an insulating film interposed therebetween, and a plurality of domains positioned in the plane of the one substrate, in which liquid crystal is alignment-divided in accordance with formation directions of the plurality of slits. One of the lower electrode and the upper electrode is a pixel electrode connected to the switching element and the other is a common electrode which applies a common potential. Each of the plurality of third wires is placed in a boundary between each of the plurality of domains in a plan view.

According to the present specification, it becomes possible to provide a liquid crystal display panel capable of narrowing a frame area and improving display quality.

DESCRIPTION OF THE PREFERRED EMBODIMENTS

The preferred embodiments of a liquid crystal display panel and a liquid crystal display in accordance with the present specification will be described. In the preferred embodiments shown below, description will be made, taking a liquid crystal display which drives liquid crystal by an FFS (Fringe Field Switching), as an example.

The First Preferred Embodiment

Figure 1:
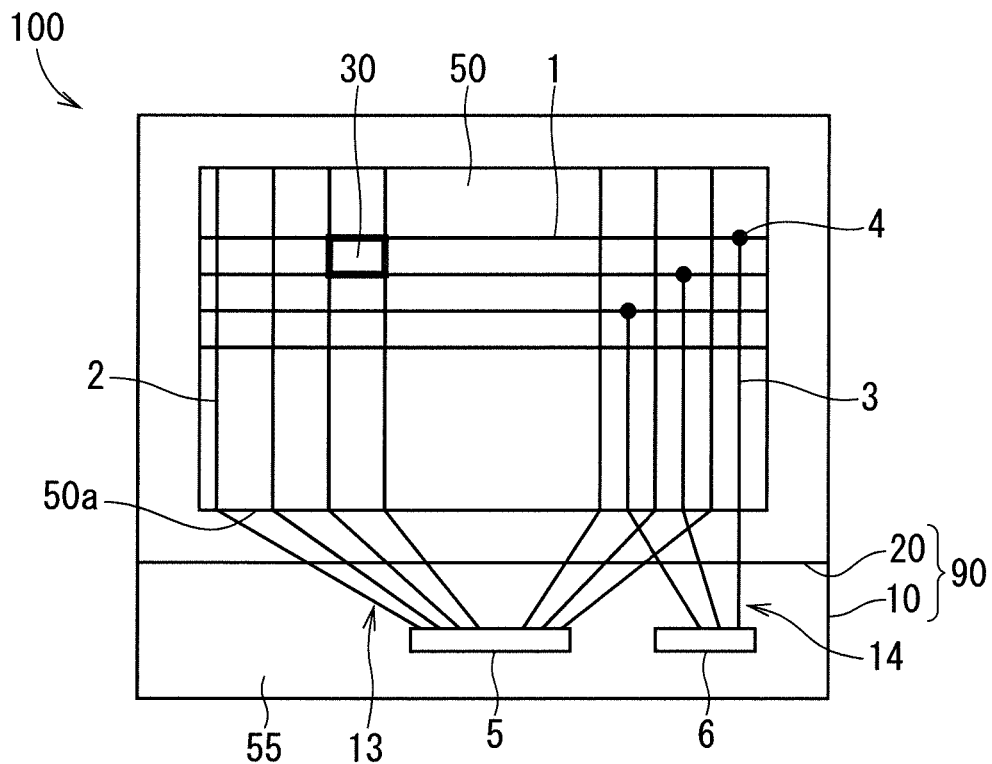
FIG. 1 is a view schematically showing a structure of a liquid crystal display panel in accordance with a first preferred embodiment.

FIG. 1 is a view schematically showing a structure of a liquid crystal display panel 90 and that of a liquid crystal display 100 including the liquid crystal display panel 90 in accordance with the first preferred embodiment. The liquid crystal display 100 is constituted of the liquid crystal display panel 90 which is a main part, and the like. Between two substrates which constitute the liquid crystal display panel 90, liquid crystal is sealed. Of the two substrates, one is an array substrate 10 and the other is a counter substrate 20.

On the array substrate 10, a plurality of source wires 2 and a plurality of horizontal gate wires 3 are wired. The source wires 2 are arranged at predetermined intervals in a horizontal direction and the horizontal gate wires 1 are arranged at predetermined intervals in a vertical direction orthogonal to the horizontal direction. Corresponding to crossing positions of the plurality of source wires 2 and the plurality of horizontal gate wires 1, a plurality of pixels 30 are arranged in a matrix form.

Further, a plurality of vertical gate wires 3 are wired. The vertical gate wires 3 are arranged at predetermined intervals in the horizontal direction and connected to the horizontal gate wires 1. Each of the vertical gate wires 3 and each of the horizontal gate wires 1 are connected to each other at a contact portion 4. That is, one vertical gate wire 3 is connected to one horizontal gate wire 1. There is no case where one vertical gate wire 3 is connected to the horizontal gate wires 1, namely, more than two horizontal gate wires 1.

In other words, each horizontal gate wire 1 and the corresponding one vertical gate wire 3 are connected to each other in a one-to-one correspondence in the first preferred embodiment. Though the exemplary case where each horizontal gate wire 1 and the corresponding one vertical gate wire 3 are connected to each other in a one-to-one correspondence is shown in FIG. 1, a wiring configuration in the present specification is not always limited to this structure. There may be a case where vertical gate wires 3 are connected to one horizontal gate wire 1. In this case, the resistance of the vertical gate wires 3 is reduced.

The inside of a plane of the array substrate 10 is broadly divided into a display area 50 formed of the pixels 30 and a frame area 55 positioned outside the display area 50. In the present first preferred embodiment, a source driver IC 5 and a gate driver IC 6 are mounted in the frame area 55 positioned outside one side 50a of a contour of the display area 50. The source driver IC 5 is connected to a plurality of source drawing wires 13. An end of each of source wires 2 is connected to an output portion of the source driver IC 5 through the corresponding one source drawing wire 13. The gate driver IC 6 is connected to a plurality of gate drawing wires 14. An end of each of vertical gate wires 3 is connected to an output portion of the gate driver IC 6 through the corresponding one gate drawing wire 14. In other words, the gate driver IC 6 is connected to each of the horizontal gate wires 1 through the corresponding one vertical gate wire 3.

Further, for simple illustration, FIG. 1 shows only some of the source wires 2, the horizontal gate wires 1, the vertical gate wires 3, the source drawing wires 13, the gate drawing wires 14, and the pixels 30. Respective input portions of the source driver IC 5 and the gate driver IC 6 and input wires connected to connection terminals included in the input portions are not shown.

The counter substrate 20 is disposed on the display area 50 of the array substrate 10, being opposed thereto, with liquid crystal (not shown) interposed therebetween. Though not shown, a color filter, a black matrix, and the like are provided on the counter substrate 20.

On both sides of the liquid crystal display panel 90, a polarizing plate and a phase difference plate are provided as necessary. The liquid crystal display 100 includes the above-described liquid crystal display panel 90, a rear surface light source (backlight) which irradiates the liquid crystal display panel 90 with illumination light, an external circuit, a case, and the like.

Figure 2:
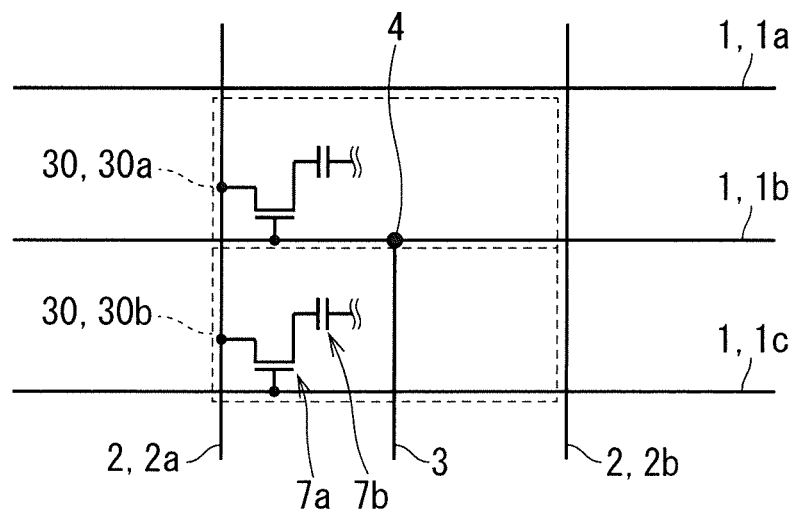
FIG. 2 is an equivalent circuit diagram showing pixels included in the liquid crystal display panel in accordance with the first preferred embodiment.

FIG. 2 is an equivalent circuit diagram showing a pixel 30a and a pixel 30b which are positioned around the contact portion 4, among the pixels 30. As described above, the horizontal gate wires 1 (horizontal gate wires 1a, 1b, and 1c) and the source wires 2 (source wires 2a and 2b) are placed, intersecting each other. The pixels 30a and 30b are positioned, being surrounded by the horizontal gate wires 1 (the horizontal gate wires 1a, 1b, and 1c) and the source wires 2 (the source wires 2a and 2b). The vertical gate wire 3 is placed between the source wires 2a and 2b and connected to the horizontal gate wire 1b through the contact portion 4. In other words, the vertical gate wire 3 is placed across the pixel 30b longitudinally.

Each pixel 30 includes a TFT 7a serving as a switching element and a capacitance 7b. Herein, a connection structure of constituent elements in the pixel 30b will be described. The horizontal gate wire 1c is connected to a gate electrode of the TFT 7a. The source wire 2a is connected to a source electrode of the TFT 7a. A drain electrode of the TFT 7a is connected to the capacitance 7b. With such a connection, a switching operation of the TFT 7a is controlled by the source driver IC 5 and the gate driver IC 6 described above.

Each pixel 30 further includes a pixel electrode though not shown in FIG. 2. The pixel electrode is formed between the drain of the TFT 7a and the capacitance 7b. Further, in each pixel 30, a common electrode is provided, being opposed to the pixel electrode. A fringe electric field formed by the pixel electrode and the common electrode drives the liquid crystal.

Figure 3:
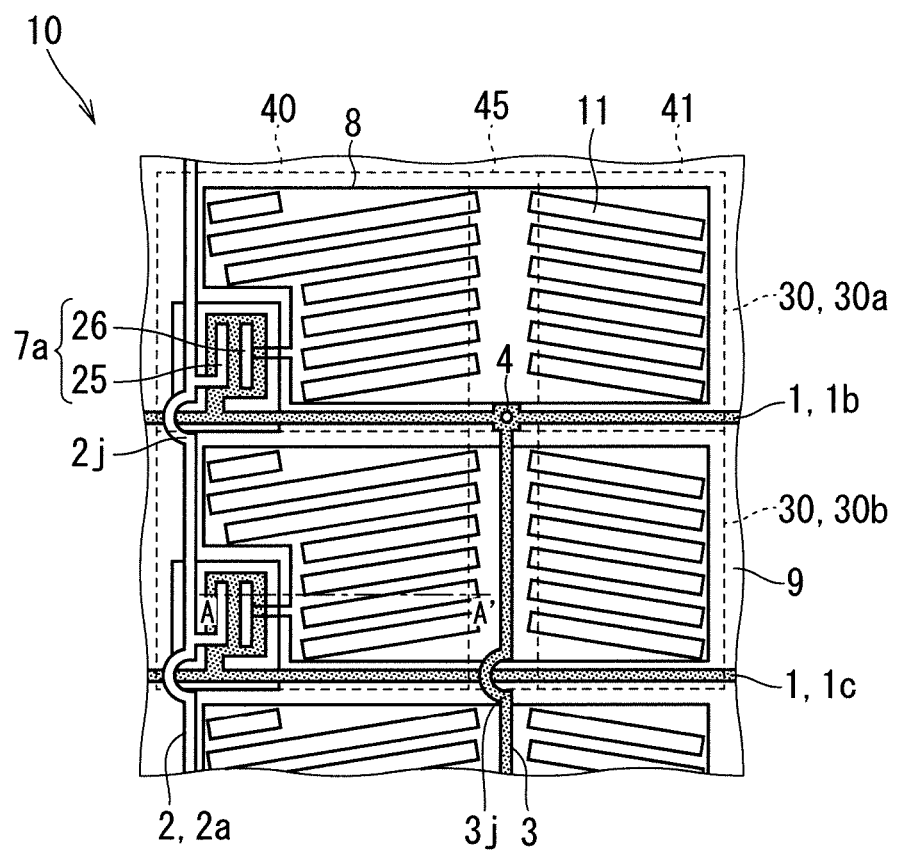
FIG. 3 is a plan view schematically showing a structure of the pixels in accordance with the first preferred embodiment.

FIG. 3 is a plan view enlargedly showing a structure of the pixels 30a and 30b which are positioned around the contact portion 4, among the pixels 30. In FIG. 3, planar arrangements of the electrodes and the like in layers of the pixels 30a and 30b which have a multilayer structure are drawn overlappingly. The TFT 7a shown in FIG. 2 is formed at a corner in a plane of each pixel 30 in FIG. 3.

Figure 4:
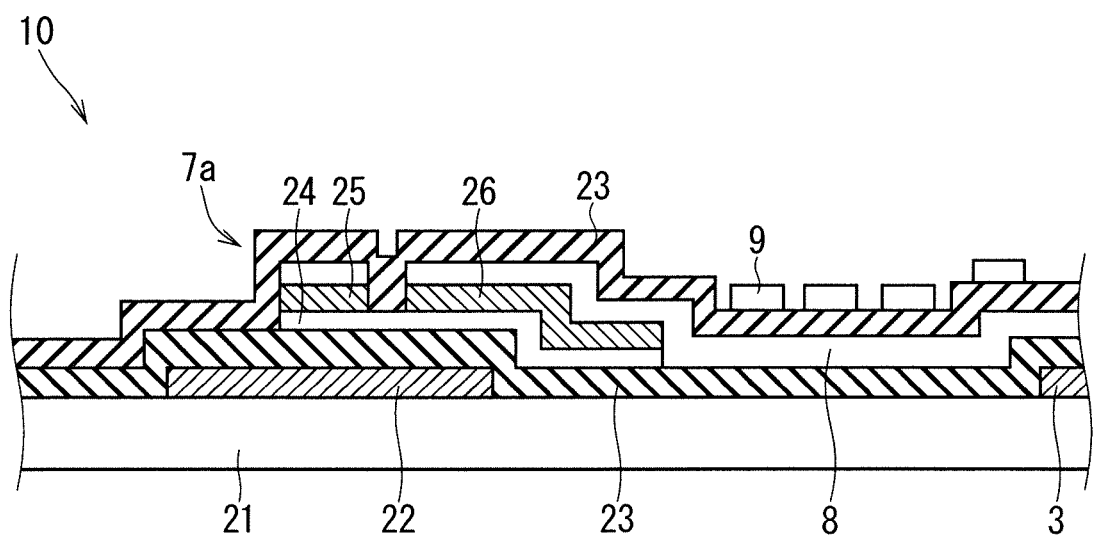
FIG. 4 is a cross section schematically showing the structure of the pixel in accordance with the first preferred embodiment.

FIG. 4 is a cross section taken along the line A-A' of FIG. 3. In the array substrate 10, on a transparent substrate 21 having an insulation property, such as glass, plastic, or the like, the TFT 7a, the pixel electrode 8, and the common electrode 9 are formed. The TFT 7a shown in FIG. 2 is formed, in which a gate electrode 22, an insulating film 23, a semiconductor layer 24, a source electrode 25, and a drain electrode 26 are layered.

Further, as shown in FIG. 3, each horizontal gate wire 1 and each source wire 2 intersect each other at an intersection 2j. Since the horizontal gate wire 1 and the source wire 2 are provided with an insulating film interposed therebetween at the intersection 2j, these wires are not short-circuited. Each horizontal gate wire 1 and each vertical gate wire 3 intersect each other at an intersection 3j. Since the horizontal gate wire 1 and the vertical gate wire 3 are provided with an insulating film interposed therebetween in different layers, the horizontal gate wire 1 and the vertical gate wire 3 are not short-circuited at the intersection 3j.

On the other hand, each vertical gate wire 3 and each horizontal gate wire 1 are short-circuited at the contact portion 4. The contact portion 4 is formed, for example, by filling a contact hole provided in the insulating film between the horizontal gate wire 1 and the vertical gate wire 3 with a material having a conductivity. The structure of the contact portion 4, however, is not limited to this one. For example, after forming a contact hole in each horizontal gate wire 1 and each vertical gate wire 3, these wires may be connected to each other with a conductive pattern other than the above. In order to prevent transmission of the backlight light, the above-described contact portion 4 is disposed outside an opening area of each pixel 30.

As shown in FIG. 4, next to the TFT 7a, the pixel electrode 8 and the common electrode 9 are provided. In the present first preferred embodiment, a lower electrode which is provided closer to the transparent substrate 21, i.e., on the lower side, is the pixel electrode 8. The pixel electrode 8 is directly connected to the drain electrode 26 of the TFT 7a.

An upper electrode which is provided above the lower electrode is the common electrode 9. The common electrode 9 is provided on the pixel electrode 8 with the insulating film 23 interposed therebetween. As shown in FIG. 3, the common electrode 9 is not formed in the area where the TFT 7a is positioned. Though not shown, in a stacking direction of layers, an insulating film is provided between the common electrode 9 and each horizontal gate wire 1 and between the common electrode 9 and each source wire 2, these are not short-circuited.

As shown in FIG. 3, a plurality of slits 11 that are openings are formed in the common electrode 9, and the plurality of slits 11 extend in a plurality of directions in the plane of the array substrate 10. In the present first preferred embodiment, the slits 11 are formed extending in two directions different from the respective directions in which the source wires 2 and the horizontal gate wires 1 are extending. Each pixel 30 includes a first domain 40 in which the slits 11 are arranged extending in one direction and a second domain 41 in which the slits 11 are arranged extending in another direction.

A boundary 45 between the first domain 40 and the second domain 41 is positioned in parallel with the source wires 2. The slits 11 are formed line-symmetrically with respect to the boundary 45. Specifically, the slits 11 in the first domain 40 and the slits 11 in the second domain 41 are formed, being inclined symmetrically with respect to the boundary 45 at a predetermined angle. Thus, in the common electrode 9, the slits 11 are formed and the boundary 45 is defined. Further, the slits 11 in the first domain 40 and the slits 11 in the second domain 41 may be formed, being connected to each other.

The above-described vertical gate wire 3 is placed in the boundary 45 between the first domain 40 and the second domain 41 in a plan view. Each vertical gate wire 3 and the common electrode 9 are insulated with an insulating film in the stacking direction of the layers, and these are not short-circuited.

Further, the common electrode 9 is formed inside the display area 50 except an area in which the slits 11 and the TFT 7a are positioned, and is formed of the same layer in the display area 50.

To the pixel electrode 8, a potential of a video data signal which contributes to display is applied through the source wire 2 and the source electrode 25. To the common electrode 9, a potential which is common to the pixels 30, namely, a common potential (also referred to as a reference potential) is applied. There arises a potential difference between the pixel electrode 8 and the common electrode 9 and a fringe electric field is formed in accordance with the shape of each slit 11. The alignment of the liquid crystal held between the counter substrate 20 and the array substrate 10 is controlled by the fringe electric field. By appropriately controlling the alignment of the liquid crystal, a video image or a still image is displayed on the liquid crystal display 100.

The direction in which the fringe electric field is formed, i.e., the direction in which the alignment of the liquid crystal is controlled depends on a formation direction of each slit 11. In the liquid crystal display panel 90 of the first preferred embodiment, the slits 11 are formed in two different directions in the plane thereof. The liquid crystal display panel 90 includes the first domain 40 and the second domain 41 in which the respective liquid crystal molecules are oriented in accordance with the formation directions of the slits 11. That is, the alignments are divided in accordance with the formation directions of the slits 11 in each pixel 30. In other words, the liquid crystal display panel 90 is multi-domained (alignment-divided). With these multi-domain structures, in an arbitrary direction, the color change is reduced and the viewing angle characteristics of the liquid crystal display panel 90 are improved. In the vicinity of the boundary 45 between the domains, however, it is difficult to control the alignment of the liquid crystal and this area is an invalid area in which the backlight light is not transmitted. Therefore, even if each vertical gate wire 3 is placed in the boundary 45, the aperture ratio of the pixel 30 is not substantially reduced. Thus, the characteristic feature of the liquid crystal display panel 90 lies in that the wires which cause reduction in the aperture ratio are placed in the boundary 45 between the domains included in each pixel 30.

As compared to the liquid crystal display panel in which each vertical gate wire 3 is placed next to and in parallel with the corresponding source wire 2, in the liquid crystal display panel 90 of the present first preferred embodiment, each vertical gate wire 3 can be placed while suppressing reduction in the aperture ratio of each pixel 30. The liquid crystal display panel 90 of the first preferred embodiment and the liquid crystal display 100 equipped with the liquid crystal display panel 90 can provide video images with high display quality while narrowing the left and right frame areas 55.

In summary, the liquid crystal display panel 90 of the first preferred embodiment includes, on one substrate (the array substrate 10) of the two substrates disposed opposite to each other with the liquid crystal held therebetween, a plurality of first wires (the plurality of source wires 2) arranged in a first direction (the horizontal direction), a plurality of second wires (the plurality of horizontal gate wires 1) arranged in a second direction (the vertical direction), and a plurality of third wires (the plurality of vertical gate wires 3) arranged in the first direction (the horizontal direction) and connected to the plurality of second wires (the plurality of horizontal gate wires 1).

Further, the liquid crystal display panel 90 includes the plurality of pixels 30 arranged in a matrix form corresponding to the crossing positions between the plurality of first wires (the plurality of source wires 2) and the plurality of second wires (the plurality of horizontal gate wires 1), the plurality of pixels 30 forming the display area 50, a first driver IC (the source driver IC 5) provided outside the display area 50 and connected to each of the plurality of first wires (the plurality of source wires 2), the first driver IC controlling the switching element (the TFT 7*a*) included in each of the plurality of pixels 30 connected to each of the plurality of first wires (the plurality of source wires 2), and a second driver IC (the gate driver IC 6) provided outside the display area 50 and connected to each of the plurality of third wires (the plurality of vertical gate wires 3), the second driver IC controlling the switching element (the TFT 7*a*) included in each of the plurality of pixels 30 connected to each of the plurality of second wires (the plurality of horizontal gate wires 1), through each of the plurality of third wires (the plurality of vertical gate wires 3).

Each of the plurality of pixels 30 includes the lower electrode, the upper electrode including the plurality of slits 11 formed extending in a plurality of directions in a plane of the one substrate (the array substrate 10), the upper electrode being provided on the lower electrode with the insulating film 23 interposed therebetween, and the plurality of domains positioned in the plane of the one substrate (the array substrate 10), in which the liquid crystal is alignment-divided in accordance with the formation directions of the plurality of slits 11. In the present first preferred embodiment, the plurality of domains are the first domain 40 and the second domain 41.

One of the lower electrode and the upper electrode is the pixel electrode 8 connected to the switching element (the TFT 7*a*) and the other is the common electrode 9 which applies the common potential. In the first preferred embodiment, the above-described upper electrode is the common electrode 9 and the lower electrode is the pixel electrode 8. Each of the plurality of third wires (the plurality of vertical gate wires 3) is placed in the boundary 45 between each of the plurality of domains in a plan view.

With the above-described structure, the liquid crystal display panel 90 of the first preferred embodiment can provide video images with high display quality while narrowing the left and right frame areas 55.

Further, the plurality of the slits 11 of the upper electrode (the common electrode 9) included in the liquid crystal display panel 90 extend in directions different from a direction in which the plurality of first wires (the plurality of source wires 2) extend and from another direction in which the plurality of second wires (the plurality of horizontal gate wires 1) extend. The plurality of the slits 11 are formed line-symmetrically with respect to the boundary 45 between each of the plurality of domains. The boundary 45 is in parallel with the plurality of first wires (the plurality of source wires 2). The liquid crystal display panel 90 having such a structure can place the plurality of vertical gate wires 3 in the shortest distance with respect to the plurality of horizontal gate wires 1 without causing reduction in the aperture ratio of each pixel 30.

Furthermore, the liquid crystal display 100 of the first preferred embodiment includes the above-described liquid crystal display panel 90 and the backlight that irradiates the liquid crystal display panel 90 with illumination light. The liquid crystal display 100 having such a structure can provide video images with high display quality while narrowing the left and right frame areas 55.

The Second Preferred Embodiment

A liquid crystal display panel and a liquid crystal display in accordance with the second preferred embodiment will be described. Description on the same structure and operation as those in the first preferred embodiment will be omitted.

As the common electrode 9, generally, a transparent conductive film is used. The resistivity of the transparent conductive film is higher than that of a metal or the like which is used for the wire. When the resistivity of the common electrode 9 is high, the difference between the maximum value and the minimum value of the resistance of the common electrode 9 in the display area 50 becomes larger. In other words, there occurs a variation in respective resistances from a driving circuit which applies the common potential to the common electrode 9 corresponding to the arrangement of each pixel 30. The resistance difference is visually recognized as luminance unevenness when a video image or a still image is displayed.

A liquid crystal display panel in which a common wire made of a material having a low resistivity is connected to the common electrode 9 can reduce the difference in the resistance inside the common electrode 9 between the maximum value and the minimum value. Materials having a low resistivity, which can be used for a wire, however, do not transmit light. For this reason, in the case of providing the common wire, there arises a problem that the aperture ratio of each pixel 30 is reduced.

Figure 5:
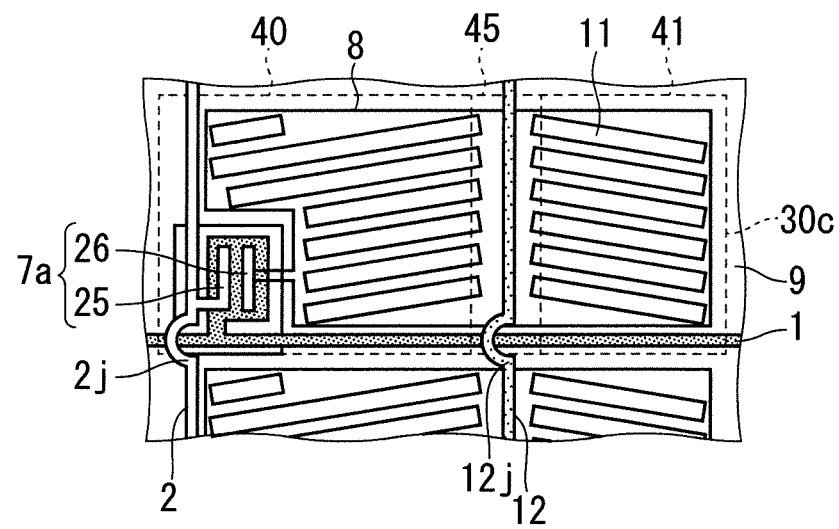
FIG. 5 is a plan view schematically showing a structure of a pixel in accordance with a second preferred embodiment.

Then, in the liquid crystal display panel of the second preferred embodiment, a common wire having a low resistivity is disposed in the boundary 45 between multi domains in which the vertical gate wires 3 are not provided. FIG. 5 is a plan view enlargedly showing one pixel 30*c* included in the liquid crystal display panel in accordance with the second preferred embodiment. In the pixel 30*c*, at least one common wire 12 connected to the common electrode 9 is placed in the boundary 45. The number of common wires 12 and the order of arrangement thereof may be determined arbitrarily. The common wire 12 may be placed in the boundary 45 included in at least a part of the pixels 30, namely, at least one pixel. In other words, the common wire 12 may be placed in at least one boundary 45.

The common wire 12 and each horizontal gate wire 1 intersect each other at an intersection 12*j*. Since the common wire 12 and the horizontal gate wire 1 are isolated from each other with an insulating film at the intersection 12j, these wires are not short-circuited. The common wire 12 is positioned in a layer lower than the insulating film which insulates the pixel electrode 8 from the common electrode 9.

The structure of the pixel in which no common wire 12 is formed and only the vertical gate wire 3 is formed in the boundary 45 is the same as that of the pixel 30b shown in the first preferred embodiment and description thereof will be omitted. Other structure is the same as that in the first preferred embodiment.

Thus, the liquid crystal display panel of the second preferred embodiment further includes at least one common wire 12 connected to the common electrode 9. The at least one common wire 12 is placed in at least one boundary 45 in a plan view. The liquid crystal display panel having such a structure can make the resistance of the common electrode 9 lower than the conventional one and provide video images with high display quality while suppressing reduction in the aperture ratio of each pixel 30.

The Third Preferred Embodiment

A liquid crystal display panel and a liquid crystal display in accordance with the third preferred embodiment will be described. Description on the same structure and operation as those in the first preferred embodiment or the second preferred embodiment will be omitted.

The liquid crystal display panel shown in the first preferred embodiment or the second preferred embodiment is effective for a display device in which the number of pixels 30 arranged in a transverse direction is larger than that of pixels 30 arranged in the longitudinal direction. On the other hand, in the display device in which the number of pixels 30 arranged in the longitudinal direction is larger than that of pixels 30 arranged in the transverse direction, the number of horizontal gate wires 1 extending in the horizontal direction is larger than that of source wires 2 extending in the vertical direction. In other words, in the display device in which the number of pixels 30 arranged in the longitudinal direction is larger than that of pixels 30 arranged in the transverse direction, there is a case where the number of rows of the boundaries 45 between the domains is smaller than the number of horizontal gate wires 1. In the case where the number of rows of the boundaries 45 is smaller than the number of vertical gate wires 3 which are required, it is impossible to implement the source driver IC 5 and the gate driver IC 6 only one side of the display area 50, unlike in the liquid crystal display panel 90 of the first preferred embodiment shown in FIG. 1.

Figure 6:
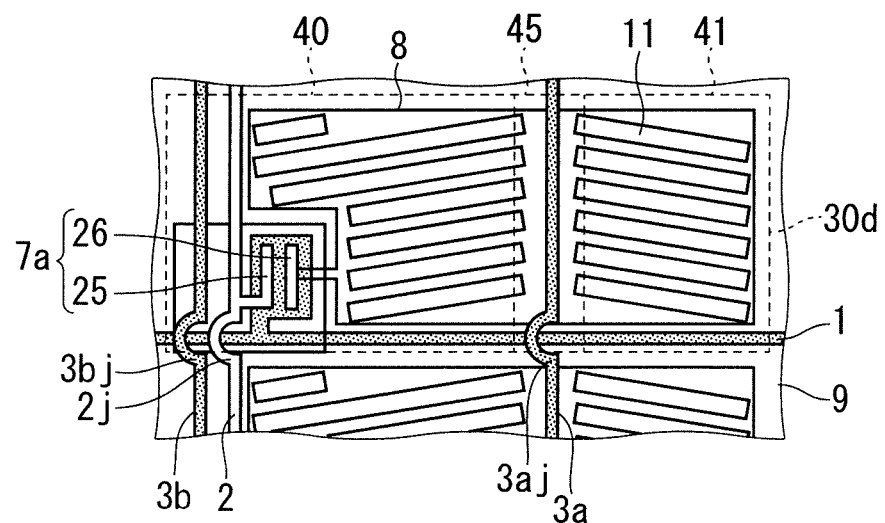
FIG. 6 is a plan view schematically showing a structure of a pixel in accordance with a third preferred embodiment.

Then, in the liquid crystal display panel of the third preferred embodiment, some of vertical gate wires 3 are placed next to and in parallel with the source wires 2. FIG. 6 is a plan view enlargedly showing one pixel 30d included in the liquid crystal display panel in accordance with the third preferred embodiment. A vertical gate wire 3b which is part of the vertical gate wires 3 is placed next to and in parallel with the source wire 2. The number of and the order of arrangement of vertical gate wires 3b which are placed in the vicinity of the source wire 2 may be determined arbitrarily.

The vertical gate wire 3b intersects each of the horizontal gate wires 1 at an intersection 3bj. Since the vertical gate wire 3b and the horizontal gate wire 1 are provided with an insulating film interposed therebetween at the intersection 3bj, these wires are not short-circuited. Further, since the vertical gate wire 3b is placed with an insulating film provided between the vertical gate wire 3b and the common electrode 9, these are not short-circuited.

Furthermore, like in the pixel 30b shown in FIG. 3, a vertical gate wire 3a is placed in the boundary 45 between the domains. Since the vertical gate wire 3a and each of the horizontal gate wires 1 are provided with an insulating film interposed therebetween at an intersection 3aj, these wires are not short-circuited. Other structure is the same as that in the first preferred embodiment or the second preferred embodiment.

Thus, in the liquid crystal display panel of the third preferred embodiment, the number of the plurality of second wires (the plurality of horizontal gate wires 1) is larger than that of the plurality of first wires (the plurality of source wires 2), and some of the plurality of third wires (the plurality of vertical gate wires 3) are placed next to and in parallel with the plurality of first wires (the plurality of source wires 2). The liquid crystal display panel having such a structure can achieve narrowing of the frame area while suppressing reduction in the aperture ratio of each pixel 30 even if the device is longitudinal.

Further, the common wire 12 described in the second preferred embodiment may be also placed next to and in parallel with each of the plurality of source wires 2, as well as in the boundary 45 between the domains. The number of and the order of arrangement of common wires 12 which are placed in the vicinity of the source wire 2 may be determined arbitrarily.

The Fourth Preferred Embodiment

A liquid crystal display panel and a liquid crystal display in accordance with the fourth preferred embodiment will be described. Description on the same structure and operation as those in any one of the first preferred embodiment to the third preferred embodiment will be omitted.

Figure 7:
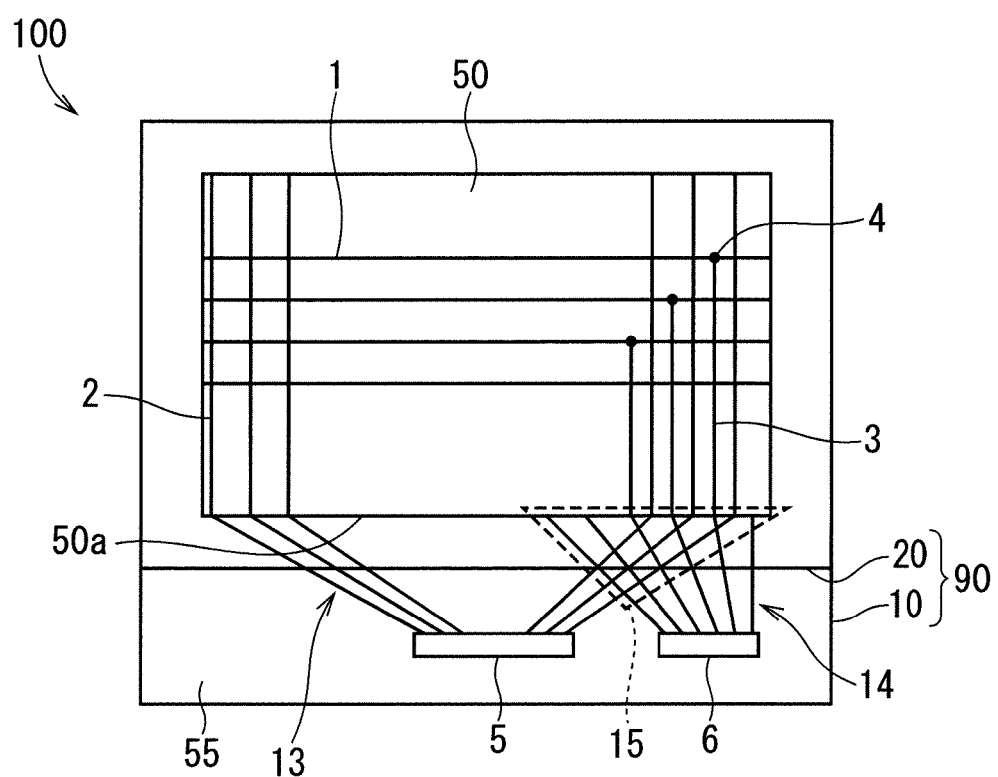
FIG. 7 is a view schematically showing a structure of a liquid crystal display panel in accordance with any one of the first to the third preferred embodiments.

FIG. 7 is a view schematically showing a structure of a liquid crystal display 100 including the liquid crystal display panel 90 described in any one of the first preferred embodiment to the third preferred embodiment. FIG. 7 shows only some of the source wires 2, the vertical gate wires 3, the horizontal gate wires 1, the source drawing wires 13, and the gate drawing wires 14.

In the liquid crystal display panel 90, an end of each of the source drawing wires 13 is connected to an end of each of the source wires 2 on one side 50a of the contour of the display area 50. The source driver IC 5 to which the other end of each of the source drawing wires 13 is connected is provided in a frame area 55a positioned outside the side 50a of the contour of the display area 50. Similarly, an end of each of the gate drawing wires 14 is connected to an end of each of the vertical gate wires 3 on the side 50a. The gate driver IC 6 to which the other end of each of the gate drawing wires 14 is connected is also provided in the frame area 55a on the side 50a.

In a case where each of the source drawing wires 13 and each of the gate drawing wires 14 are extended from the same side 50a of the display area 50, formed is a crossing area 15 in which each source drawing wire 13 and each gate drawing wire 14 intersect each other. Since each source drawing wire 13 and each gate drawing wire 14 are provided with an insulating film interposed therebetween, these wires are insulated from each other. In the crossing area 15, however, parasitic capacitance is generated due to the insulating film and the like. There is a case where there occurs unevenness in still images and video images and the display quality of the liquid crystal display panel is deteriorated, depending on the magnitude of the parasitic capacitance.

Figure 8:
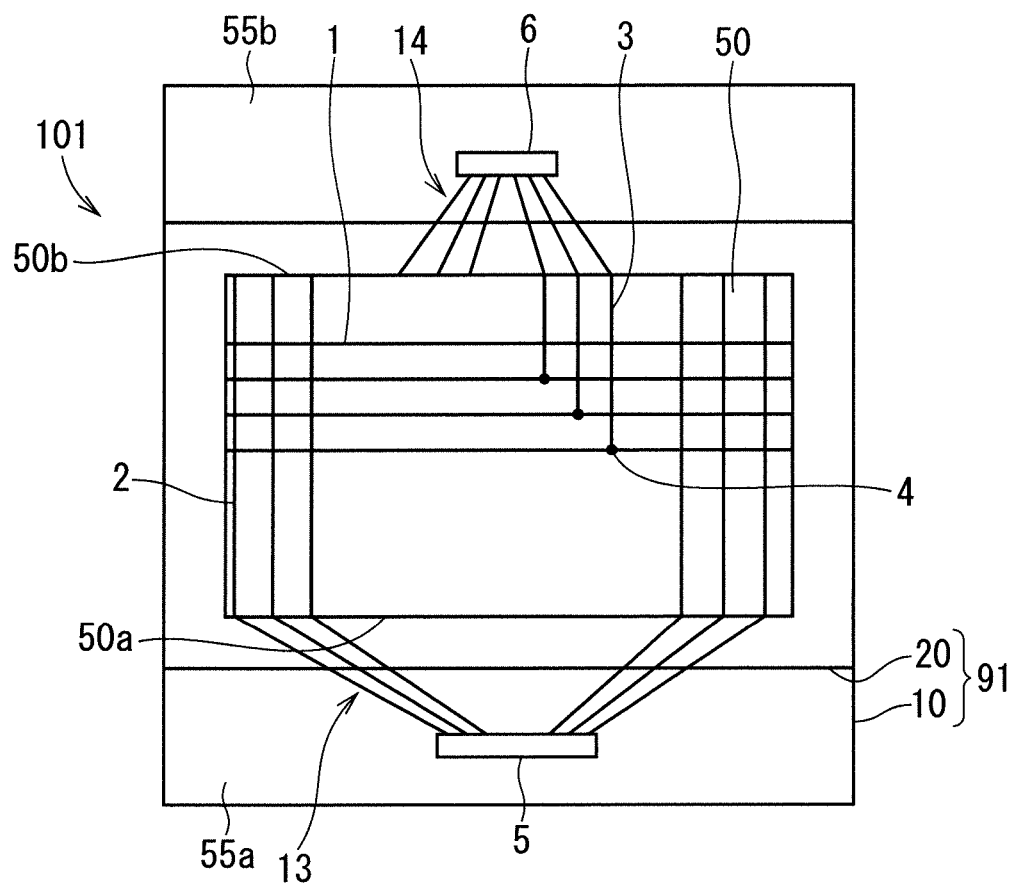
FIG. 8 is a view schematically showing a structure of a liquid crystal display panel in accordance with a fourth preferred embodiment.

FIG. 8 is a view schematically showing a structure of a liquid crystal display panel 91 and a liquid crystal display 101 including the liquid crystal display panel 91 in accordance with the fourth preferred embodiment. Like FIG. 7, FIG. 8 shows only some of the source wires 2, the vertical gate wires 3, the horizontal gate wires 1, the source drawing wires 13, and the gate drawing wires 14. In the liquid crystal display panel 91, an end of each of the source drawing wires 13 (a plurality of first drawing wires) is connected to an end of each of the source wires 2 on one side 50a of the contour of the display area 50. The source driver IC 5 to which the other end of each of the source drawing wires 13 is connected is provided in the frame area 55a positioned outside the side 50a of the contour of the display area 50. On the other hand, an end of each of the plurality of gate drawing wires 14 (a plurality of second drawing wires) is connected to an end of each of the vertical gate wires 3 on the other side 50b opposed to the side 50a with the display area 50 interposed therebetween. The gate driver IC 6 to which the other end of each of the gate drawing wires 14 is connected is provided in a frame area 55b positioned outside the other side 50b.

In the liquid crystal display panel 91 having such a structure, the crossing area in which each source drawing wire 13 and each gate drawing wire 14 intersect each other is not formed. In other words, the liquid crystal display panel 91 of the fourth preferred embodiment can reduce occurrence of the parasitic capacitance and provide video images with high display quality. Further, the liquid crystal display panel 91 or the liquid crystal display 101 equipped with the liquid crystal display panel 91 can narrow the left and right frame areas.

In the above-described preferred embodiments, though the liquid crystal display panels 90 and 91 in which the lower electrode is the pixel electrode 8 and the upper electrode is the common electrode 9 have been exemplarily shown, even a liquid crystal display panel in which the lower electrode is the common electrode 9 and the upper electrode is the pixel electrode 8 can produce the same effects as those in the above-described preferred embodiments.

Further, though the liquid crystal display panel in which the plurality of first wires are the plurality of source wires 2, the plurality of second wires are the plurality of horizontal gate wires 1, and the plurality of third wires are the plurality of vertical gate wires 3 have been exemplarily shown in the above-described preferred embodiments, even a liquid crystal display panel in which the source wires and the gate wires are exchanged can produce the same effects. Specifically, a liquid crystal display panel in which the plurality of first wires are a plurality of gate wires, the plurality of second wires are a plurality of horizontal source wires, and the plurality of third wires are a plurality of vertical source wires can produce the same effects. In this case, it is possible to provide a liquid crystal display panel in which the upper and lower frame areas are narrowed.

Furthermore, though the channel etch inverted staggered type TFT has been exemplarily shown in the above-described preferred embodiments, an etch stopper inverted staggered type TFT, a top-gate type TFT, or the like can produce the same effects as those in the above-described preferred embodiments.

In the above-described preferred embodiments, the liquid crystal display panel and the liquid crystal display in which the source driver IC 5 or the gate driver IC 6 is implemented in the frame area 55 have been exemplarily shown. Even a liquid crystal display panel and a liquid crystal display including a driver IC with TAB (Tape Automated Bonding) mount or a liquid crystal display panel and a liquid crystal display in which the driver IC is formed of a TFT of polysilicon or the like on the array substrate 10 at the same time as the TFT is formed in each pixel, however, can produce the same effects as those in the above-described preferred embodiments.

In the present invention, within the scope of the invention, the above-described preferred embodiments may be freely combined, and may be modified and omitted as appropriate.

While the invention has been shown and described in detail, the foregoing description is in all aspects illustrative and not restrictive. It is therefore understood that not-illustrated numerous modifications and variations can be devised without departing from the scope of the invention.

What is claimed is:
1. A liquid crystal display panel, comprising:
on one substrate of two substrates disposed opposite to each other with liquid crystal held therebetween,
a plurality of first wires arranged in a first direction;
a plurality of second wires arranged in a second direction;
a plurality of third wires arranged in the first direction and connected to the plurality of second wires;
a plurality of pixels arranged in a matrix form corresponding to crossing positions between the plurality of first wires and the plurality of second wires, the plurality of pixels forming a display area;
a first driver IC provided outside the display area and connected to each of the plurality of first wires, the first driver IC controlling a switching element included in each of the plurality of pixels connected to each of the plurality of first wires; and
a second driver IC provided outside the display area and connected to each of the plurality of third wires, the second driver IC controlling the switching element included in each of the plurality of pixels connected to each of the plurality of second wires through each of the plurality of third wires, wherein
each of the plurality of pixels includes:
a lower electrode;
an upper electrode including a plurality of slits formed extending in a plurality of directions in a plane of the one substrate, the upper electrode being provided on the lower electrode with an insulating film interposed therebetween;
a plurality of domains positioned in the plane of the one substrate and alignment-divided in accordance with formation directions of the plurality of slits; and
at least one boundary that spatially separates the plurality of domains in each of the plurality of pixels,
one of the lower electrode and the upper electrode is a pixel electrode connected to the switching element and the other is a common electrode which applies a common potential, and
each of the plurality of third wires is placed in the at least one boundary in each of the plurality of pixels in a plan view.

2. The liquid crystal display panel according to claim 1, wherein
the plurality of slits of the upper electrode extend in directions different from a direction in which the plurality of first wires extend and from another direction in which the plurality of second wires extend, the plurality of slits being formed line-symmetrically with respect to the at least one boundary, and the at least one boundary is in parallel with the plurality of first wires.

3. The liquid crystal display panel according to claim 1, wherein
some of the plurality of third wires are placed next to and in parallel with the plurality of first wires.

4. The liquid crystal display panel according to claim 3, wherein
the number of the plurality of second wires is larger than that of the plurality of first wires.

5. The liquid crystal display panel according to claim 1, further comprising:
at least one common wire connected to the common electrode, wherein
the at least one common wire is placed in the at least one boundary in plan view.

6. The liquid crystal display panel according to claim 5, wherein the at least one common wire is placed next to and in parallel with the plurality of first wires.

7. The liquid crystal display panel according to claim 1, further comprising:
a plurality of first drawing wires provided outside the display area, the plurality of first drawing wires connecting the plurality of first wires and the first driver IC; and
a plurality of second drawing wires provided outside the display area, the plurality of second drawing wires connecting the plurality of third wires and the second driver IC, wherein
an end of each of the plurality of first drawing wires is connected to an end of each of the plurality of first wires on one side of a contour of the display area, and
an end of each of the plurality of second drawing wires is connected to an end of each of the plurality of third wires on the other side opposed to the one side with the display area interposed therebetween.

8. A liquid crystal display, comprising:
a liquid crystal display panel according to claim 1, and
a backlight that irradiates the liquid crystal display panel with illumination light.

9. A liquid crystal display panel, comprising:
on one substrate of two substrates disposed opposite to each other with liquid crystal held therebetween,
a plurality of first wires arranged in a first direction;
a plurality of second wires arranged in a second direction;
a plurality of third wires arranged in the first direction and connected to the plurality of second wires;
a plurality of pixels arranged in a matrix form corresponding to crossing positions between the plurality of first wires and the plurality of second wires, the plurality of pixels forming a display area;
a first driver IC provided outside the display area and connected to each of the plurality of first wires, the first driver IC controlling a switching element included in each of the plurality of pixels connected to each of the plurality of first wires; and
a second driver IC provided outside the display area and connected to each of the plurality of third wires, the second driver IC controlling the switching element included in each of the plurality of pixels connected to each of the plurality of second wires through each of the plurality of third wires, wherein
each of the plurality of pixels includes:
a lower electrode;
an upper electrode including a plurality of slits formed extending in a plurality of directions in a plane of the one substrate, the upper electrode being provided on the lower electrode with an insulating film interposed therebetween; and
a plurality of domains positioned in the plane of the one substrate and alignment-divided in accordance with formation directions of the plurality of slits,
one of the lower electrode and the upper electrode is a pixel electrode connected to the switching element and the other is a common electrode which applies a common potential,
each of the plurality of third wires is placed in a boundary between each of the plurality of domains in a plan view, and
the number of the plurality of second wires is larger than that of the plurality of first wires.

* * * * *